United States Patent [19]

O'Dowd

[11] Patent Number: 5,184,240
[45] Date of Patent: Feb. 2, 1993

[54] DE-MULTIPLEXER

[76] Inventor: Ronan F. O'Dowd, 9 Rowan Close, Celbridge, Ireland

[21] Appl. No.: 671,363

[22] Filed: Mar. 19, 1991

[30] Foreign Application Priority Data

Mar. 20, 1990 [IE] Ireland .................................. 1000/90

[51] Int. Cl.$^5$ .............................................. H04J 14/08
[52] U.S. Cl. ....................................... 359/135; 372/25
[58] Field of Search ............... 359/123, 135, 138, 140, 359/158; 307/244, 311; 370/112; 372/25, 38

[56] References Cited

U.S. PATENT DOCUMENTS 4,980,891 12/1990 Izadpanah .......................... 359/138

FOREIGN PATENT DOCUMENTS 0356302 2/1990 European Pat. Off. .

OTHER PUBLICATIONS

Kaede Kazuhisa, Frequency-stabilized semiconductor laser oscillator, Oct. 4, 1984, EP 0 128 297 A3 European Abstract.

Primary Examiner—Edward L. Coles, Sr.
Assistant Examiner—Rafael Bacares
Attorney, Agent, or Firm—Scully, Scott, Murphy & Presser

[57] ABSTRACT

A method of de-multiplexing and a time division de-multiplexer (1) for optic signals is disclosed. A multiplexed optic signal (A) is delivered through a cavity of a multi-region semiconductor laser amplifier device (2). The clock component is extracted (6) and it is used to drive (7) the contacts (3,4) of the device (2) with activating signals so that there is an electronic response in each contact for one channel of the optic signal (A) only. Thus, separate electronic data channels are sensed by sense amplifiers (14). The de-multiplexer (1) thus both de-multiplexes and converts optic signals to electronic signals simultaneously.

10 Claims, 1 Drawing Sheet

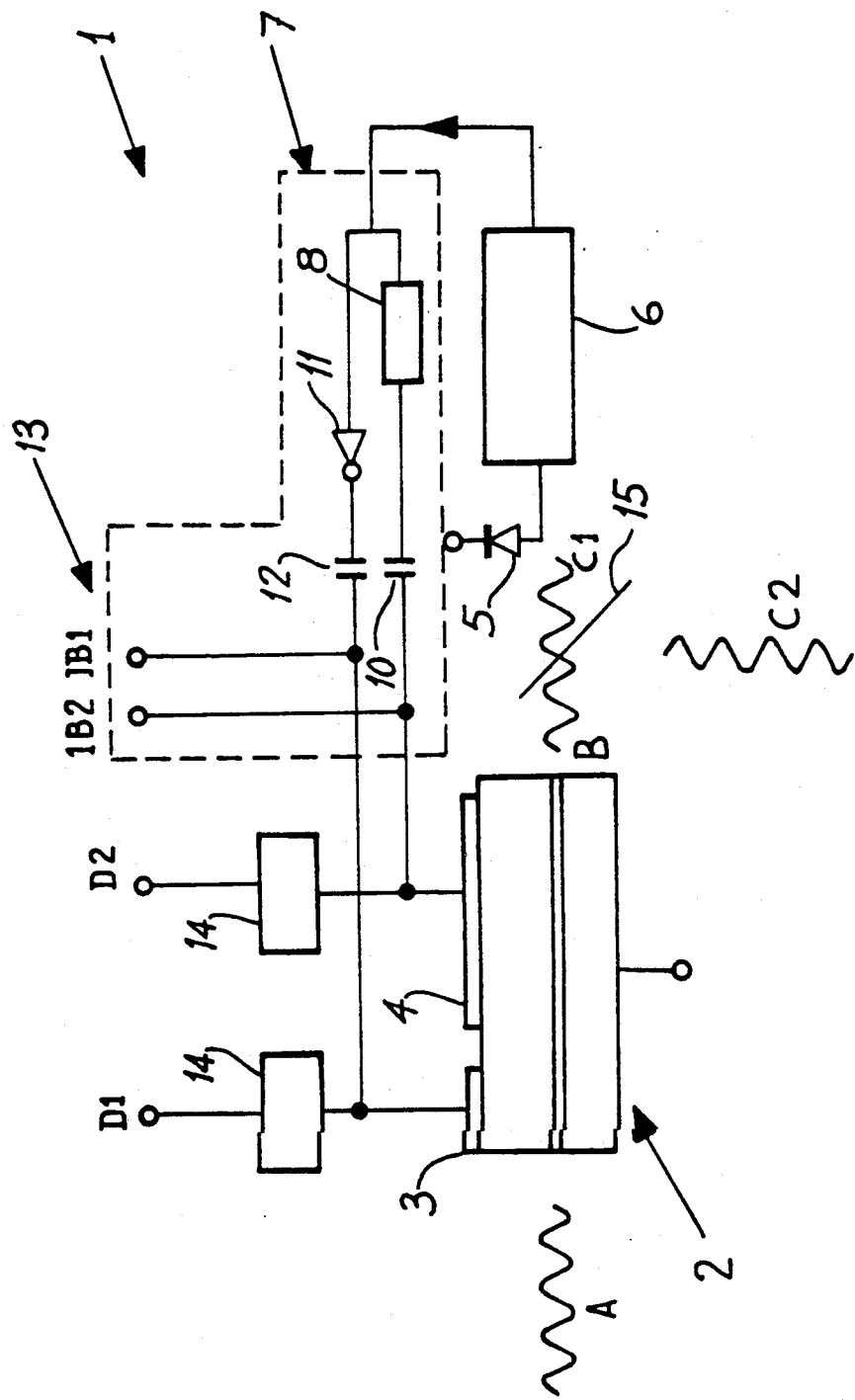

DE-MULTIPLEXER

FIELD OF THE INVENTION

The invention relates to the de-multiplexed particularly to time division de-multiplexing and conversion to electronic form of optic signals.

BACKGROUND TO THE INVENTION

Heretofore, opto-electronic conversion and time division de-multiplexing have been carried out in separate stages. It is firstly necessary to convert a multiplexed optic signal to electronic form and then to de-multiplex the electronic signal. For example, European Patent Specification No. 356,302 (Etat Francais) discloses an optical wavelength de-multiplexing apparatus. A separate apparatus would be required for time division de-multiplexing of output signals from this apparatus. This is complex and expensive. Accordingly, in many cases optic signal transmission is not used where there are many nodes such as in a network, although it would otherwise be advantageous.

OBJECTS OF THE INVENTION

The invention is directed toward overcoming these problems by providing a method of de-multiplexing and a de-multiplexer which is simpler and less expensive.

SUMMARY OF THE INVENTION

The invention provides a method of time division de-multiplexing an optic signal having two or more data channels, the method comprising the steps of:
monitoring channel time frames of the optic signal;
directing the optic signal through the cavity of a multi-region semiconductor laser amplifier device;
in response to monitoring the optic signal, delivering activating signals to contacts of the multi-region semiconductor laser amplifier device in synchronism with the channels so that each contact has an electronic response to an optic excursion in one channel only; and
sensing the electronic response in each contact to generate separate electronic data channels.

According to another aspect, the invention provides a de-multiplexer comprising:
an input port communicating with the cavity of a multi-region semiconductor laser amplifier device having a plurality of contacts;
means for monitoring an incoming optic signal which is time division multiplexed with a plurality of data channels;
means for activating the contacts of the multi-region semiconductor laser device in response to monitoring of the optic signal so that each contact has an electronic response to an optic excursion in one data channel only of the optic signal; and
means for sensing the electronic response in each contact.

DETAILED DESCRIPTION OF THE EMBODIMENTS

The invention will be more clearly understood from the following description of some preferred embodiments thereof, given by way of example only with reference to the accompanying drawing which is a schematic representation of a de-multiplexer of the invention.

Referring to the drawings, there is illustrated a de-multiplexer of the invention indicated generally by the reference numeral 1. The de-multiplexer 1 comprises a multi-region semiconductor laser amplifier device 2, which in this embodiment has two side-by-side contacts 3 and 4. An input port, not shown, is provided for direction of an incoming weak optic signal A to the cavity of the device 2.

The de-multiplexer 1 further comprises optic signal monitoring means, namely, a photo-detector 5 connected to an LC tank clock extraction circuit 6.

The output of the clock extraction circuit 6 is connected to a drive circuit 7 for the device 2. The drive circuit 7 has a pair of lines derived from the output line of the clock extraction circuit 6. One line of the drive circuit 7 has a delay/driver circuit 8 and a DC capacitor 10 and is connected to the contact 4 of the device 2. The other line has an invertor/driver 11 and a DC isolation capacitor 12 and is connected to the contact 3 of the device 2. Each of the contacts 3 and 4 are also connected to a DC bias source 13 forming part of the drive circuit 7. A sense amplifier 14 is connected to each of the contacts 3 and 4. The de-multiplexer 1 further comprises a beam splitter 15 mounted between the device 2 and the photo detector 5.

In operation, the received weak optic signal A is directed to the cavity of the device 2. As it passes through the cavity it is amplified due to stimulated emission in phase with the travelling optical wave, causing addition of photons. This is caused by the DC bias source 13. The bias may be chosen for each contact to optimize amplification in a certain wavelength optic signal is represented by the letter B in the drawing. The amplified optic signal B is split by the beam splitter 15 into two signals, namely amplified optic signals C1 and C2. The signal C2 is directed to another node where the signal is required. This may, for example, occur where the de-multiplexer 1 is in a node of a network and the received optic signal is to be re-transmitted to other nodes. In this case, not only is the signal re-transmitted, but it is amplified beforehand.

The amplified optic signal C1 is monitored by the photodetector and the clock extraction circuit 6 extracts the clock frequency of the signal and also the time position of the signal. In response to the monitoring, the clock extraction circuit 6 delivers a clock signal to the drive circuit 7. In the drive circuit 7 the clock signal is split into two. One clock signal is delivered to the contact 4 via the delay driver circuit 8, and the DC isolation capacitor 10. The other clock signal is delivered to the contact 3 via the inverter/driver circuit 11 and the DC isolation capacitor 12. Thus, the signals being received at the contacts 3 and 4 are activating signals synchronized with each other and mutually inverted. For example, as the signal at contact 3 is increasing the signal at contact 4 is simultaneously decreasing, and vice versa or the phase relationship may be controlled to other than 180° by the delay circuit 8 to allow for signal response times in the device 2. The DC bias source 13 acts to keep the device 2 in the mode for amplification, whereas the activating signal received at the contacts 3 and 4 have the effect only of activating the relevant contact so that there is an electrical response in the contact to an optic excursion in the received optic signal A. The activating signals are synchronized with the time frames of the received optic signal and are at the correct frequency so that when data for a first channel, say, channel D1 is being transmitted through the cavity, the contact 3 is activated and senses any optic excursion in that channel. In the next cycle, only the contact 4 is activated and any optic excursions in the channel D2 result in an electrical response in the contact. Electrical responses in the contacts 3 and 4 are sensed by the sense amplifiers 14 which generate the separate electronic data channels D1 and D2.

It will thus be appreciated that the de-multiplexer 1 in a simple way both converts optic signals to electronic signals and simultaneously time division de-multiplexes the optic signal. This is achieved by use of a known and widely available multi-region semiconductor laser amplifier device and by relatively simple clock extraction and driver circuits. There is further the additional advantage that the received optic signal is amplified and re-transmitted, for example, to another node of a network.

The invention is not limited to the embodiments hereinbefore described. For example, it is envisaged that a separate amplifier may be used for amplification of the signals, or indeed the received optic signal may not be amplified. Further, the skilled reader will appreciate that many different types of clock extraction circuit could be used and similarly the drive circuit may be varied. It is also envisaged that there may be more than two contacts, each associated with a time division multiplexed data channel. For example, there may be four contacts for four time division multiplexed data channels. The important point is that the received optic signal is monitored so that each contact is driven in synchronism with the time frames of the optic signal and at the same frequency so that each contact has an electronic response to an optic excursion in one channel only.

The invention is not limited to the embodiments hereinbefore described, but may be varied in construction and detail.

I claim:

1. A method of time division de-multiplexing an optic signal having two or more data channels, the method comprising the steps of:
    monitoring channel time frames of the optic signal;
    directing the optic signal through the cavity of a multi-region semiconductor laser amplifier device;
    in response to monitoring the optic signal, delivering activating signals to contacts of the multi-region semiconductor laser amplifier device in synchronism with the channels so that each contact has an electronic response to an optic excursion in one channel only; and
    sensing the electronic response in each contact to generate separate electronic data channels.

2. A method as claimed in claim 1, wherein the optic signal is amplified before being monitored.

3. A method as claimed in claim 2, wherein the amplified signal is split for re-transmission of the signal to another node.

4. A method as claimed in claim 2, wherein the optic signal is amplified in the semiconductor laser amplifier device.

5. A method as claimed in claim 1, wherein the activating signals are derived from a clock signal generated on monitoring of the optic signal.

6. A method as claimed in claim 5, wherein the optic signal has two data channels and the activating signals are derived by splitting the clock signal and transmitting it directly to one contact and inverting it and transmitting it to the other contact in synchronism.

7. A de-multiplexer comprising:
    an input port communicating with the cavity of a multi-region semiconductor laser amplifier device having a plurality of contacts;
    monitoring means for monitoring an incoming optic signal which is time division multiplexed with a plurality of data channels;
    activating means having an input connected to the monitoring means and an output connected to the contacts for activating the contacts of the multi-region semiconductor laser device in response to monitoring of the optic signal so that each contact has an electronic response to an optic excursion in one data channel only of the optic signal; and
    means for sensing electronic response in each contact.

8. A de-multiplexer as claimed in claim 7 further comprising bias means for biasing the multi-region semiconductor laser amplifier device as an amplifier for amplification of the received optic signal.

9. A de-multiplexer as claimed in claim 8 further comprising a beam splitter for splitting of the amplified optic signal and re-transmission of the signal to another node.

10. A de-multiplexer comprising:
    an input port communicating with the cavity of a multi-region semiconductor laser amplifier device having a plurality of contacts;
    monitoring means for monitoring an incoming optic signal which is time division multiplexed with at least two data channels and for extracting a clock signal;
    activating means having an input connected to the monitoring means and an output connected to the contacts, the activating means comprising means for generating activating signals by splitting the clock signal and inverting a split signal, and means for delivering the activating signals to two contacts in synchronism so that each contact has an electronic response to an optic excursion in one data channel only of the optic signal; and
    means for sensing electronic response in each contact.

* * * * *